(12) United States Patent
Roach

(10) Patent No.: US 6,879,215 B1
(45) Date of Patent: Apr. 12, 2005

(54) SYNTHETIC CIRCUIT COMPONENT AND AMPLIFIER APPLICATIONS

(75) Inventor: Steven D. Roach, Colorado Springs, CO (US)

(73) Assignee: Linear Technology Corporation, Milpitas, CA (US)

(*) Notice: Subject to any disclaimer, the term of this patent is extended or adjusted under 35 U.S.C. 154(b) by 0 days.

(21) Appl. No.: 10/144,160

(22) Filed: May 10, 2002

(51) Int. Cl.$^7$ ............................................... H03F 1/14
(52) U.S. Cl. ........................ 330/292; 330/76; 330/156; 330/307
(58) Field of Search ..................... 330/76, 292, 307, 330/156; 4/76

(56) References Cited

U.S. PATENT DOCUMENTS

| | | | |
|---|---|---|---|
| 3,573,644 A | | 4/1971 | Evel .............................. 330/9 |
| 4,524,332 A | * | 6/1985 | Gay ............................ 330/294 |
| 5,121,075 A | | 6/1992 | Roach ......................... 330/126 |
| 5,140,279 A | * | 8/1992 | Scott, III ..................... 330/156 |
| 5,621,353 A | * | 4/1997 | Botti et al. .................... 330/51 |
| 5,745,008 A | * | 4/1998 | Luong et al. ................ 330/292 |

OTHER PUBLICATIONS

Addis, John, "Three technologies on one chip make a broadband amplifier", *Electronics The International Magazine of Electronics Technology*, Jun. 5, 1972, pp. 103–107.
Ahuja, B.K., "Implementation of Active Distributed RC Anti–Aliasing/Smoothing Filters", *IEEE Journal of Solid–State Circuits*, vol. SC–17, No. 6, pp. 339–342.
AMCC Product Brief 1.0/1.25GBPSVCSELDRIVER, May 10, 1999, pp. 1–3.
Dascher, David J., "Measuring Parasitic Capacitance and Inductance Using TDR", *Hewlett–Packard Journal*, Apr. 1996, pp. 1–19.
Ikalainen, Pertti, K. "An RLC Matching Network and Application in 1–20 GHZ Monolithic Amplifier", *IEEE MTT–S International Microwave Symposium Digest*, vol. I, 1989, pp. 1115–1118.
Khoury, John, M., "Synthesis of Arbitrary Rational Transfer Funtions is S Using Uniform Distributed RC Active Circuits", IEEE Transactions on Circuits and Systems, vol. 37, No. 4, Apr. 1990, pp. 464–472.
Khoury, John, M., "On the Design of Constant Settling Time AGC Circuits", *IEEE Transactions on Circuits and Systems*, vol. 45, No. 3, Mar. 1998, pp. 283–294.
MAXIM, "Interfacing Maxim Laser Drivers with Laser Diodes", May 2000, pp. 1–12.
Sackinger, Eduard, et al., "A 3GHz, 32dB CMOS Limiting Amplifier for SONET OC–48 Receivers", *IEEE International Solid–State Circuits Conference*, 2000, p. 158.
SUMMIT Microelectronics, Inc. "Dual Loop Laser Diode Adaptive Power Controller with Look Up Table" (SML2108), Oct. 3, 2001, pp. 1–21.
Swartz, R.G. et al., "An Integrated Circuit for Multiplexing and Driving Injection Lasers", *IEEE Journal of Solid–State Circuits*, vol. SC–17, No. 4, Aug. 1982, pp. 753–760.

* cited by examiner

*Primary Examiner*—Khanh V. Nguyen
(74) *Attorney, Agent, or Firm*—Fish & Neave IP Group of Ropes & Gray LLP; Robert W. Norris; Jeffrey D. Mullen

(57) ABSTRACT

Synthetic circuit elements and amplifier applications for synthetic circuit elements are provided. The synthetic circuit elements disclosed herein may be configured to compensate for some or all of the parasitic capacitance normally associated with circuit elements disposed on a substrate providing a selectable impedance characteristic. Amplifier circuit constructed using such synthetic circuit elements exhibit improved performance characteristics such as improved recovery time, frequency response, and time domain response.

11 Claims, 8 Drawing Sheets

SYNTHETIC CIRCUIT COMPONENT AND AMPLIFIER APPLICATIONS

BACKGROUND OF THE INVENTION

This invention relates to synthetic circuit components and certain applications for synthetic circuit components that involve improving the frequency response of amplifier circuitry.

From a conceptual point of view, the simplest signal processing task is that of signal amplification. The need for amplification arises because certain "weak" signals, such as those produced by transducers, are frequently too small for reliable detection or processing. Amplifying weak signals increases signal amplitude while preserving the details of the subject waveform, making signal acquisition and additional signal processing feasible.

Currently, circuit designers may choose from a wide variety of amplifier configurations to obtain certain desired performance characteristics. For example, in a communications system, a voltage amplifier may be used to increase the magnitude of a data signal that has become attenuated from traveling across a lengthy transmission line. In a different application, such as a power supply, a current amplifier may be used that provides only a modest amount of voltage gain but substantial current gain. In yet other applications, amplifiers may be chosen for their frequency attributes or for their ability to perform some filtering or shaping of the frequency spectrum.

One characteristic of amplifier circuitry that is often of concern to system designers is frequency response. As a general principle, it is desirable to have the bandwidth of the amplifier be as large as possible so that it may be used in a wide range of applications.

In the past, input networks with large time constants have been utilized to improve the low frequency response of amplifier circuitry (i.e., reliably amplify low frequency signals). An example of a prior art circuit using this technique is shown in FIG. 1. As shown, amplifier circuit 100 includes amplifier 110, coupling capacitor 120, resistor 130 and bias voltage 140. Capacitor 150 represents the parasitic capacitance that often accompanies the input network of amplifier 110. The values of resistor 130 and coupling capacitor 120 are typically selected to minimize jitter and amplitude deterioration experienced when amplifier 110 is required to maintain $V_{OUT}$ at a constant level over a relatively long period of time. This may occur, for example, when a digital communication system is required to produce a long series of logic high signals.

One deficiency of this approach, however, is that such input networks require relatively large components. In the example above, capacitor 120 may have a value of about 33 pF and resistor 130 may have a value of about 1 MΩ. Using components of this size with concomitant parasitic capacitance, tends to limit the bandwidth and increase recovery time of circuit 100 in addition to occupying a significant amount of die space when disposed on an integrated circuit.

Thus, in view of the foregoing, it would therefore be desirable to provide circuits and methods that improve the bandwidth and recovery time of an amplifier. It would also be desirable to provide circuits and methods for reducing the size of the components in an input network of the amplifier.

SUMMARY OF THE INVENTION

One object of the present invention is to provide circuits and methods that improve the bandwidth of an amplifier.

Another object of the present invention is to provide circuits and methods that improve the recovery time of an amplifier.

Another object of the present invention is to provide circuits and methods for reducing the size of the components in an input network of the amplifier.

Another object of the present invention is to provide novel synthetic circuit elements with adjustable impedance characteristics.

These and other objects are accomplished in accordance with the principles of the present invention by providing synthetic circuit elements with controllable impedance characteristics and amplifier applications therefor. The synthetic circuit elements compensate for parasitic capacitance normally associated with components disposed on a substrate. Amplifier circuits constructed using such synthetic circuit elements exhibit improved performance characteristics such as improved recovery time, frequency response, and time domain response.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
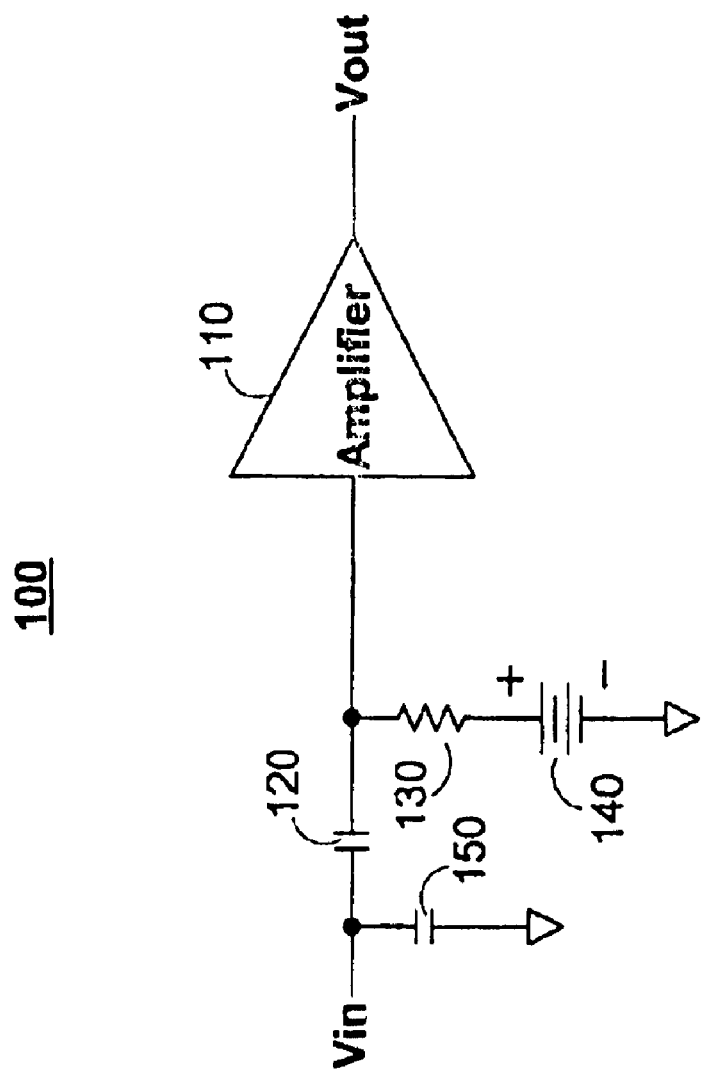
FIG. 1 is schematic diagram of a prior art amplifier circuit.
Figure 2:
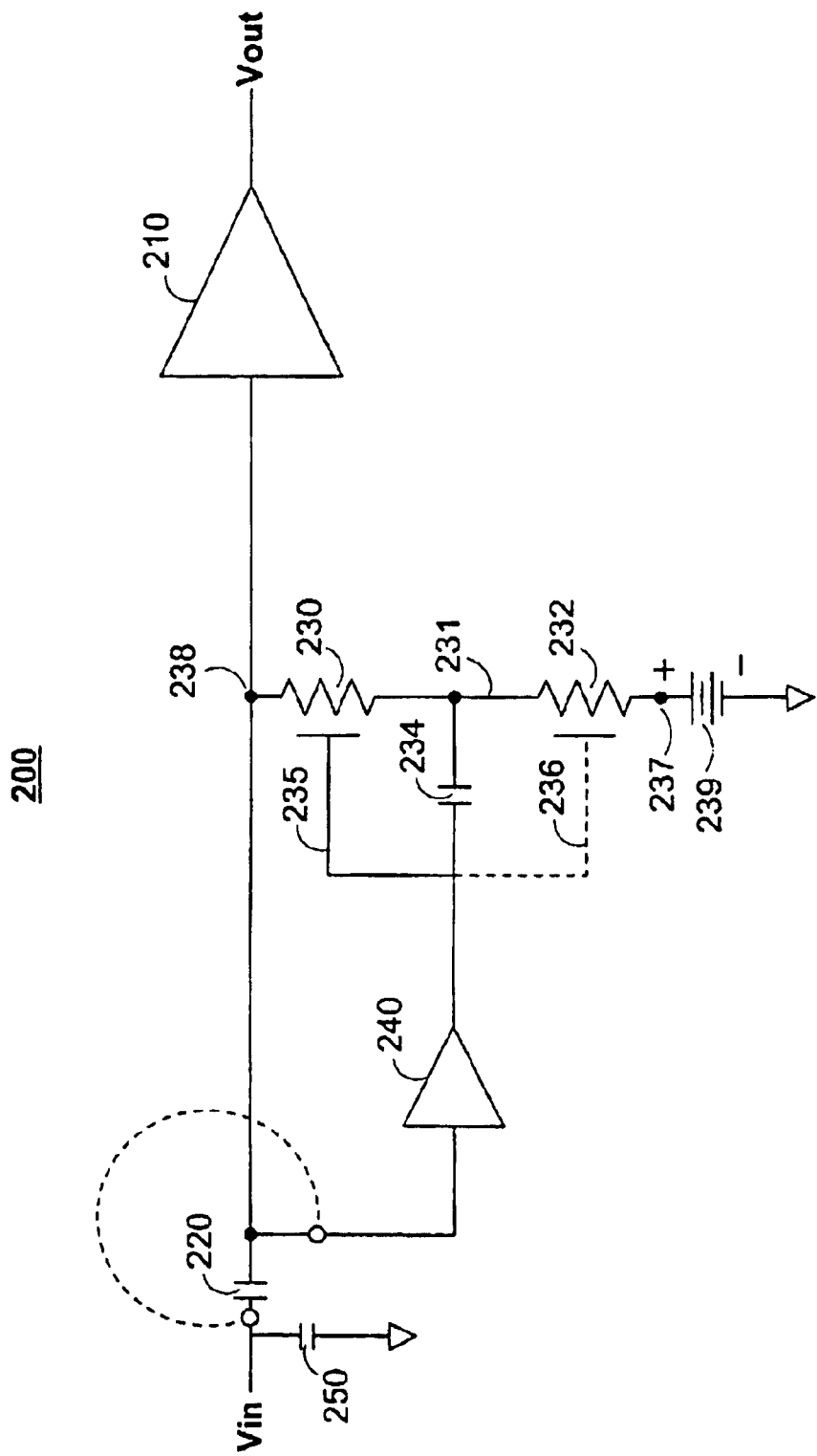
FIG. 2 is a schematic diagram of an amplifier circuit constructed in accordance with the principles of the present invention.

FIG. 2 is a schematic diagram of an amplifier circuit 200 constructed in accordance with the principles of the present invention. Amplifier circuit 200 includes amplifier 210, AC coupling capacitor 220, synthetic circuit element 230 (and optionally synthetic circuit element 232), coupling capacitor 234, and bootstrap amplifier 240. Capacitor 250 represents the parasitic capacitance that accompanies the input network of amplifier 210. As illustrated by the dotted line in FIG. 2, $V_{IN}$ may be connected to amplifiers 210 and 240, bypassing coupling capacitor 220.

Although other arrangements are possible, amplifier circuit 200 is preferably disposed on a semiconductor die (not shown) and may be fabricated using field effect transistors (FETs), bipolar junction transistors (BJTs), a combination of the two, or any other integrated circuit technology, if desired. Moreover, synthetic circuit elements 230 and 232 may be formed from material present on a typical integrated circuit (discussed in more detail below).

Amplifier 200 has been improved as compared to amplifier 100, by the addition of bootstrap amplifier 240, synthetic circuit elements 230 and 232, and coupling capacitor 234. As FIG. 2 shows, the output of bootstrap amplifier 240 is coupled to synthetic circuit element 230 through transmission paths 235 and 231 (through coupling capacitor 234). In some embodiments, it may also be desirable to couple synthetic circuit element 232 to bootstrap amplifier 240 (via transmission path 236). Generally speaking, the purpose of bootstrap amplifier 240 and synthetic circuit components 230 and 232 is to provide and maintain a high impedance bias circuit for amplifier 210 in order to obtain an improved time domain response from amplifier 200 as compared to prior art systems. Further, as will be explained in more detail below, the resistive and frequency response characteristics of synthetic circuit elements 230 and 232 may be varied to improve certain performance characteristics of circuit 200 such as improved frequency response and fast settling time.

Figure 3:
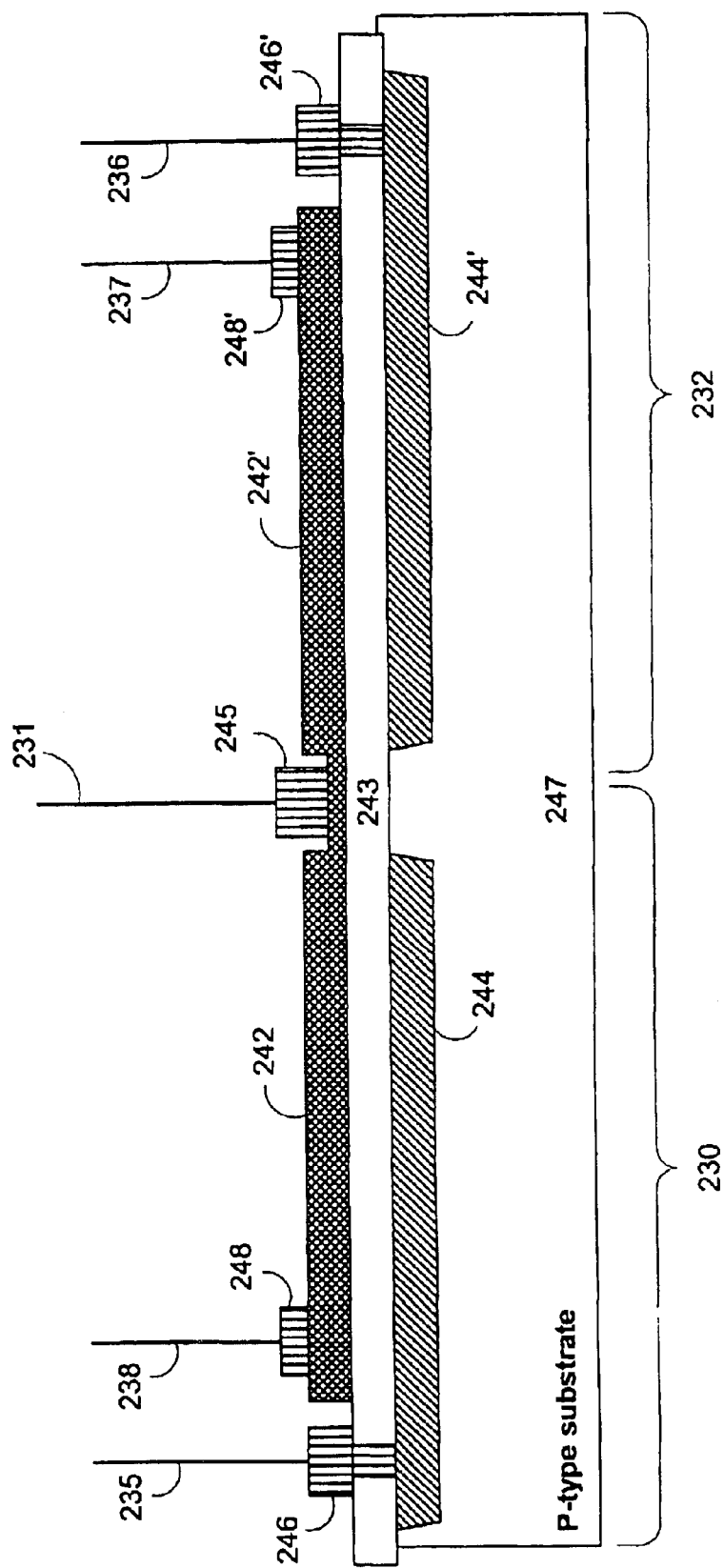
FIG. 3 is a physical cross sectional view of a synthetic circuit element constructed in accordance with the principles of the present invention based on a polysilicon type resistor suitable for use in the amplifier circuit of FIG. 2.

FIG. 3 shows a cross-sectional view of one possible embodiment of synthetic circuit elements 230 and 232 constructed in accordance with the principles of the present invention. As can be seen, these elements are based on the design of a conventional integrated circuit-type polysilicon resistor. Moreover, synthetic circuit elements 230 and 232 act primarily as resistive circuit elements and in many cases function substantially similar to a conventional polysilicon resistor, but with certain enhanced characteristics. Synthetic circuit element 230 may include polysilicon resistor 242, insulator 243, N-well portions 244, bootstrap contact 245, N-well contacts 246, and P-type substrate 247. Synthetic circuit element 232 includes substantially the same components and therefore uses prime versions of the some reference numbers used in element 230 to denote corresponding components (e.g., 242 and 242').

Although two synthetic circuit elements are shown in FIGS. 2 and 3, it will be understood that any number by may be used if desired (i.e., one or more). Furthermore, because elements 230 and 232 operate in substantially the same way, the operation of synthetic circuit element 230 described in the following is also generally applicable to element 232.

As shown in FIG. 3, the output of bootstrap amplifier 240 may be connected to various portions of the synthetic circuit elements such as at bootstrap contact 245 (through capacitor 234). Amplifier 240 may also be coupled to one or more N-well contacts 246 and 246' depending on the needs of a user. In some embodiments, one or more N-well contacts 246 may be connected to ground rather than bootstrap amplifier 240 (not shown) to tailor the frequency response characteristics of amplifier 210 to meet specific needs. Synthetic circuit elements 230 and 232 connect to other circuits such as bias voltage 239 and amplifier circuit 210 at nodes 237 and 238 respectively through contact points 248 and 248'.

Synthetic circuit element 230 operates by manipulating the amount of effective parasitic capacitance that is experienced by resistor 242. Because a certain amount of parasitic capacitance exists at the junctions between resistors 242 and N-well portions 244, the response of resistor 242 will change over frequency. For example, when a relatively low frequency signal is applied, the parasitic capacitance will tend to act as an open circuit, having little effect on performance i.e., element 230 acts like a pure resistor. However, as the frequency increases, some of the parasitic capacitance begins to behave like a short circuit, conducting an increasing amount of current, which attenuates any signal passing through resistor 242. As the frequency continues to increase, greater portions of signal are dissipated, attenuating the signal even further. Thus, resistor 242 tends to function more and more like a low pass filter as signal frequency increases. This property can be problematic in circuit applications where frequency dependent signal attenuation is undesirable.

Synthetic circuit element 230 allows a user to partially or fully correct for this problem by varying the amount of parasitic capacitance experienced by resistor 242. This is accomplished by coupling a drive signal, such as the one produced by amplifier 240, to portions of element 230. For example, coupling the drive signal to resistor 242 at contact 245 reduces the current flow from element 230 to element 232 and supplies current that charges the parasitic capacitance between resistor 242 and N-well portions 244. As a result, the tendency of synthetic circuit element 230 to function as a low pass filter at high frequency is reduced (i.e., it tends to cancel the frequency effects of the parasitic capacitance).

The effective parasitic capacitance on resistor-242 may be further reduced by coupling the drive signal produced by amplifier 240 to one or more conductive sections formed by N-well portions 244 (through contacts 246). Specifically, this technique reduces the parasitic capacitance between P-type substrate 247 and resistor 242. Applying the drive signal to both resistor 242 and N-well portions 244 provides an effective way to control the amount of parasitic capacitance experienced by resistor 242.

Moreover, this capacitive compensation effect is directly proportional to the strength of the drive signal applied to resistor 242. Generally speaking, when the gain of amplifier 240 is between zero and one, the greater the amplitude of the drive signal, the less parasitic capacitance experienced by resistor 242. This is true until the net effective parasitic capacitance is fully canceled. For the case where amplifier 240 provides a negative gain, the parasitic capacitance experienced by resistor 242 increases. For the case where amplifier 240 provides a gain greater than or equal to one, resistor 240 experiences a "negative capacitance" and the potential for spontaneous oscillation increases.

Synthetic circuit element 230 may operate in essentially three different modes: under-compensated, perfectly-compensated, and over-compensated. Element 230 may be under-compensated by applying a drive signal that fails to fully cancel the effects of parasitic capacitance on resistor 242. This may be accomplished in many ways. For example, a drive signal of insufficient magnitude may be applied to contacts 245 and 246, or a signal of sufficient magnitude may be applied to only contact 245 or just to one contact 246 and not the other. Another technique may include phase shifting the drive signal so it is out of phase with the signal in resistor 242. In the case where resistor 242 is under-compensated, it still has some parasitic capacitance; and therefore continues to exhibit some low-pass filter characteristics but with a higher cutout frequency than an uncompensated case. This configuration may be desirable, for example, when only partial reduction of parasitic capacitance is required (e.g., when constructing an attenuator).

Synthetic circuit element 230 may be perfectly-compensated by applying a drive signal that fully compensates for parasitic capacitance experienced by resistor 242. This may be accomplished by providing a drive signal that is substantially in phase and has substantially the same magnitude as the signal passing through resistor 242. In this case, the parasitic capacitive effects are substantially canceled so that element 230 acts a pure resistor (i.e., provides a constant resistance value that does not vary with frequency). This configuration may be desirable, for example, when constructing certain circuitry such as an attenuator.

Synthetic circuit element 230 may be over-compensated by applying a drive signal that over-compensates for parasitic capacitance. Overcompensation may be achieved whenever the drive signal applied to element 230 is substantially in phase with and has a greater magnitude than the signal passing through resistor portion 242. In this case, the applied signal produces a negative impedance (capacitance) effect that causes the impedance of element 230 to increase somewhat or "peak" as frequency increases. In the over-compensated state, element 230 exhibits a frequency response similar to a large inductor. This configuration may be desirable, for example, when constructing certain circuitry such as a digital communications circuitry.

Figure 4:
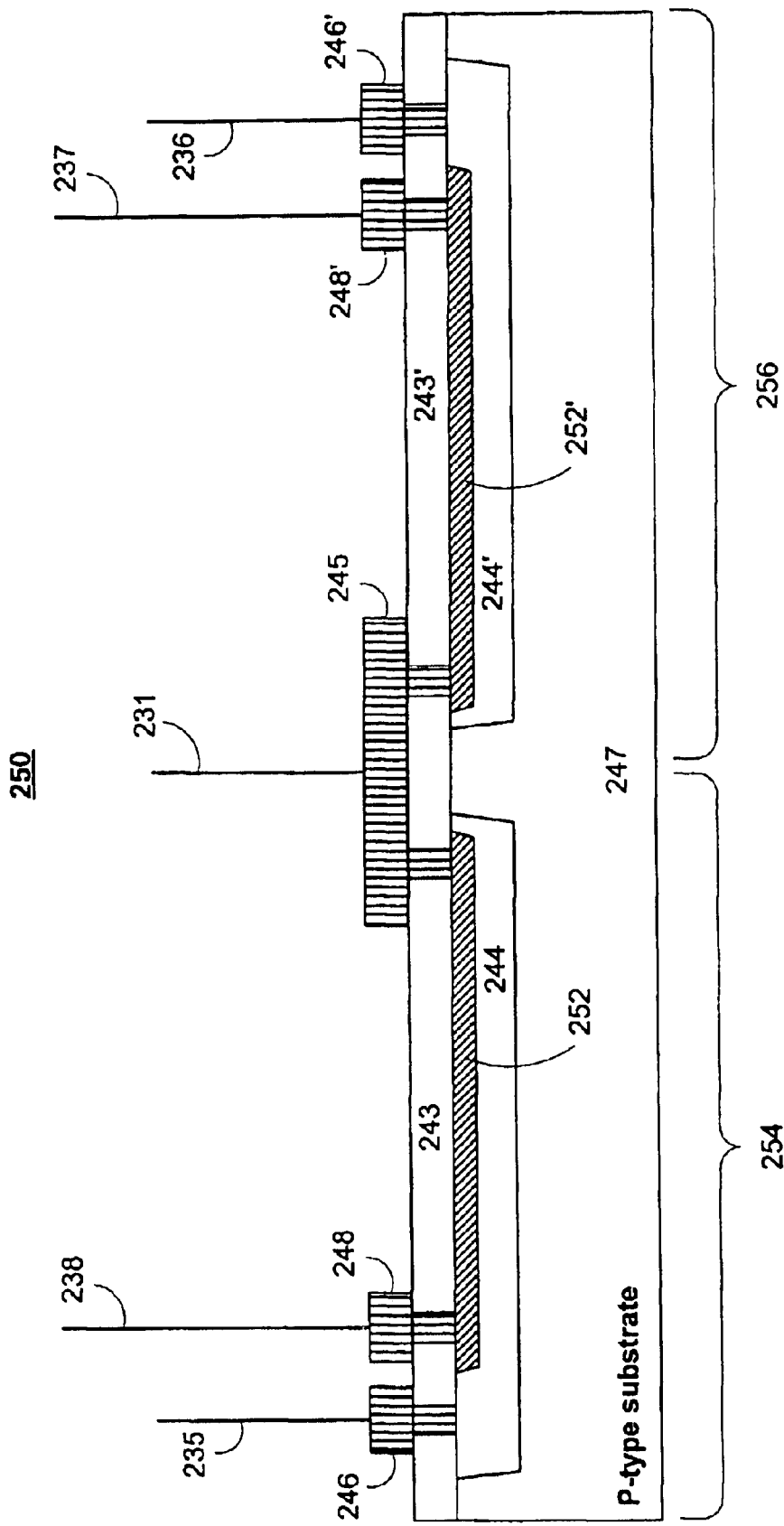
FIG. 4 is a physical cross sectional view of a synthetic circuit element constructed in accordance with the principles of the present invention based a diffused or ion implanted type resistor suitable for use in the amplifier circuit of FIG. 2.

FIG. 4 illustrates additional synthetic circuit elements 254 and 256 constructed in accordance with the principles of the present invention. Elements 254 and 256 are similar to elements 230 and 232 in many ways, and therefore the reference numbers for like elements remains the same. The primary difference between the two is the fabrication technique used to produce their respective resistor portions. In elements 254 and 256, resistor 252 may be a diffused or ion-implanted type resistor with insulator 243 located on top rather than a polysilicon type resistor like resistor 242 with an insulator located underneath it. Otherwise, these specific implementations operate in substantially the same way. It will be understood, however, that synthetic circuit elements shown in FIGS. 3 and 4 represent only two embodiments of a synthetic circuit element constructed according to the present invention, and that many other embodiments are possible. For example, portions of elements 254 and 256 may be configured as transistors (e.g., as FETs—section 252 would operate as a channel, portion 243 would operate as a gate insulator, and a gate terminal would be added) to perform substantially the functions described above (not shown). In this case, the well, gate, or both may receive a drive signal form a bootstrap amplifier to provide compensation.

Figure 5:
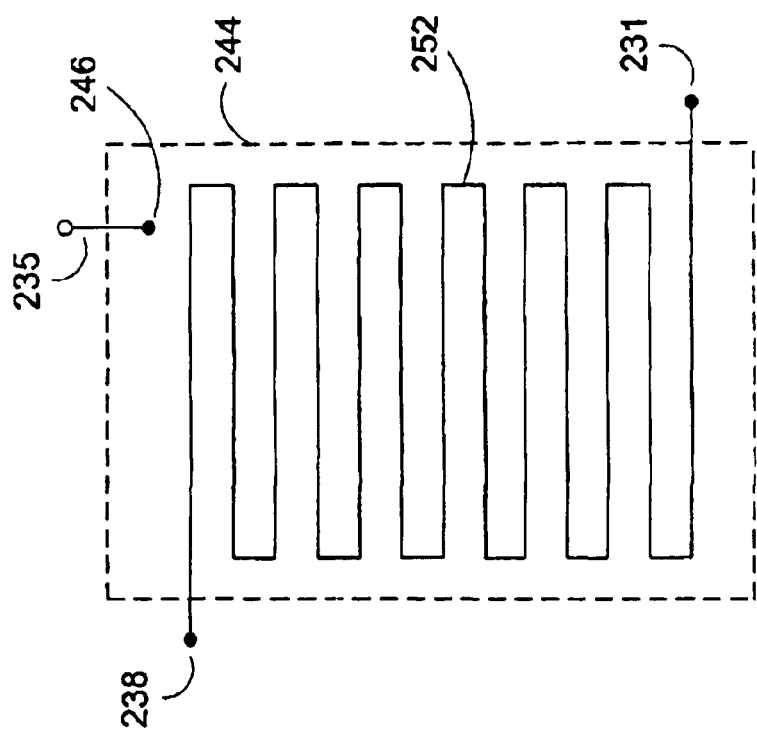
FIG. 5 is a top angle view of a physical layout of the synthetic circuit element of FIG. 4.

FIG. 5 is a top view of one embodiment of synthetic circuit element 254 illustrating how an N-well may be used to bootstrap the parasitic capacitance of a resistor. As shown, resistor 252 may be placed on top of N-well section 244, which in this case, spans the entire area underneath resistor 252. Node 238 is connected to external circuitry while the drive signal from amplifier 240 is connected to N-well contact 246. Node 231 may be coupled to the drive signal, another synthetic circuit element, to ground or to another bias signal (not shown). The drive signal conducts through N-well well section 244 effectively charging the "bottom plate" of the parasitic capacitance, either reducing, canceling, or enhancing its effect.

The synthetic circuit elements described above may be used in a wide variety of electronic applications. One suitable application is the amplifier circuit shown in FIG. 2. As shown, amplifier 200 is biased by synthetic circuit elements 230 and 232 and bias voltage 239. In this particular application, which is suitable for use in a high speed communications system, it is desirable to over-compensate synthetic circuit elements 230 and 232 to provide a high impedance bias circuit whose impedance tends to peak at frequencies comparable to the time constant associated with elements 230 and 232 (also may be comparable with the time constant of coupling capacitor 220). This arrangement has several advantages over prior art systems. One advantage is a relatively high cutin frequency (i.e., the frequency at which the amplifier begins to effectively amplify the input signal, sometimes referred to as the 3 dB point) which filters out low frequency noise and promotes fast settling times. Another advantage is a vastly improved time domain response that allows amplifier 200 to accurately reproduce long strings of logic low or logic high signals without sagging.

Figure 6:
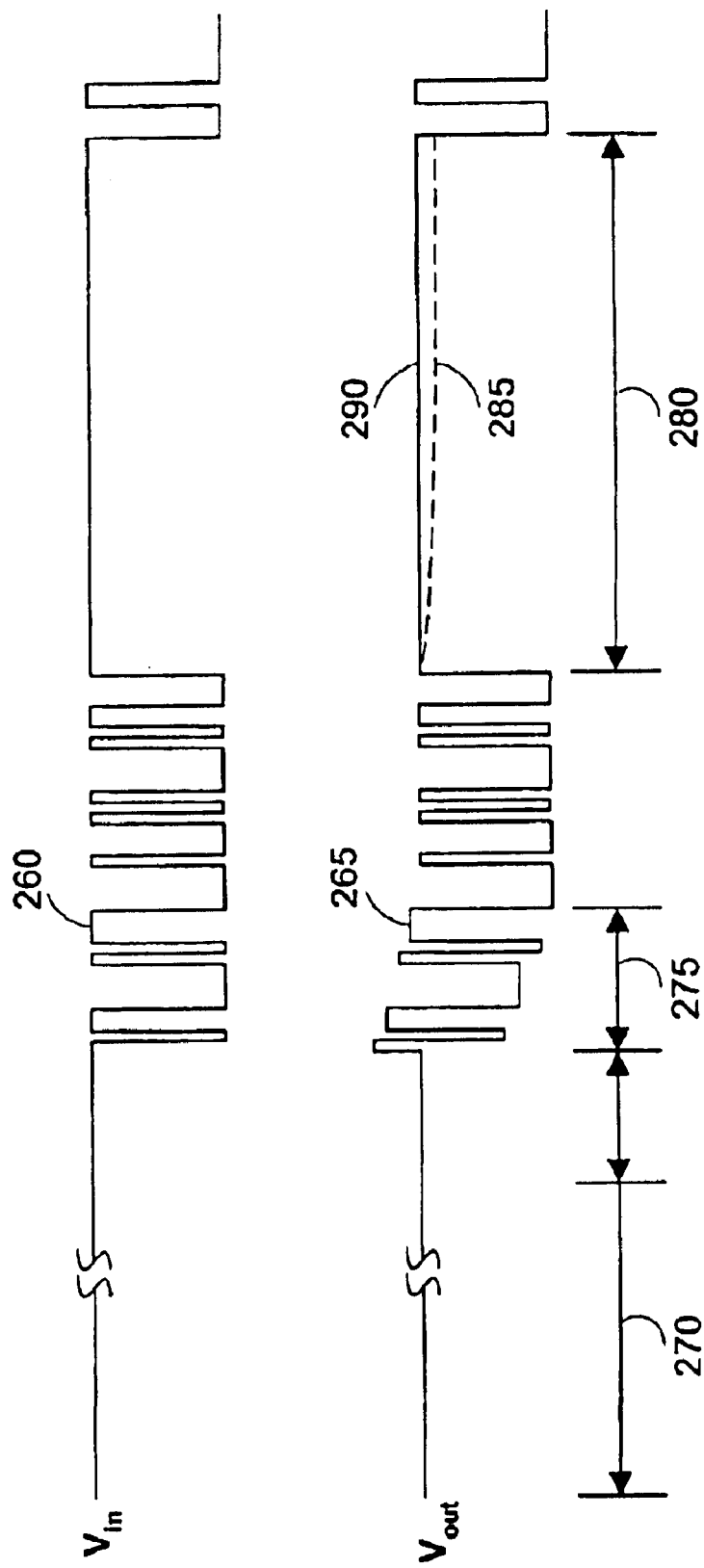
FIG. 6 shows two waveforms generally illustrating the improved time domain response of the amplifier circuit shown in FIG. 2.

These advantages may be more fully understood by considering the waveforms shown in FIG. 6. In FIG. 6, waveform 260 represents an input signal ($V_{IN}$) applied to the input of amplifier 200. Waveform 265 represents the output signal ($V_{OUT}$) produced by amplifier 200 in response to input signal 260. In FIG. 6, initial period 270 illustrates the case where waveform 260 has been stable at a logic high state for an indefinite period (although it will be understood that a logic low is also possible). During this period, coupling capacitor 220 becomes charged to a steady DC value. When waveform 260 begins to vary (e.g., when digital data transmission resumes) capacitor 220 must discharge during interval 275 (or must charge if held at a logic low), as shown in FIG. 6, before the incoming signal is reliably transmitted. Next, during interval 280, a long continuous string of logic high bits is supplied by waveform 260. Waveform portion 290 illustrates the virtually perfect replication of logic high bits for the length of the string provided by amplifier 200 compared to prior art systems waveform that tend to suffer from significant amplitude deterioration (i.e., sag) in this situation (depicted by dotted line 285).

Furthermore, because synthetic circuit elements 230 and 232 may provide the needed impedance characteristics for optimum frequency response, the physical size of capacitor 220 and the synthetic circuit elements used in amplifier 200 may be reduced by a factor ten or more as compared to comparable components used in prior art systems. This saves valuable die space on an integrated circuit and reduces power consumption. In addition, the smaller capacitor 220 becomes, the greater the reduction of overall parasitic capacitance, which reduces capacitive loading on the circuitry producing VIN, increasing overall speed of circuit 200. This feature is highly desirable in any type of digital transmission system, such as an optical communications system, where data is frequently interrupted. Thus, the degree of compensation provided to synthetic circuit elements in amplifier 200 may be chosen to obtain a desired recovery time.

Using the synthetic circuit elements described above it is possible to tailor the amount of parasitic capacitance experienced by a particular circuit element in order to obtain certain frequency-related performance characteristics. As described above, synthetic circuit elements may be under-compensated, perfectly-compensated, or over-compensated depending on the application. Furthermore, it is possible to vary compensation within these categories to obtain components that are almost perfectly-compensated, strongly over-compensated, etc.

Figure 7:
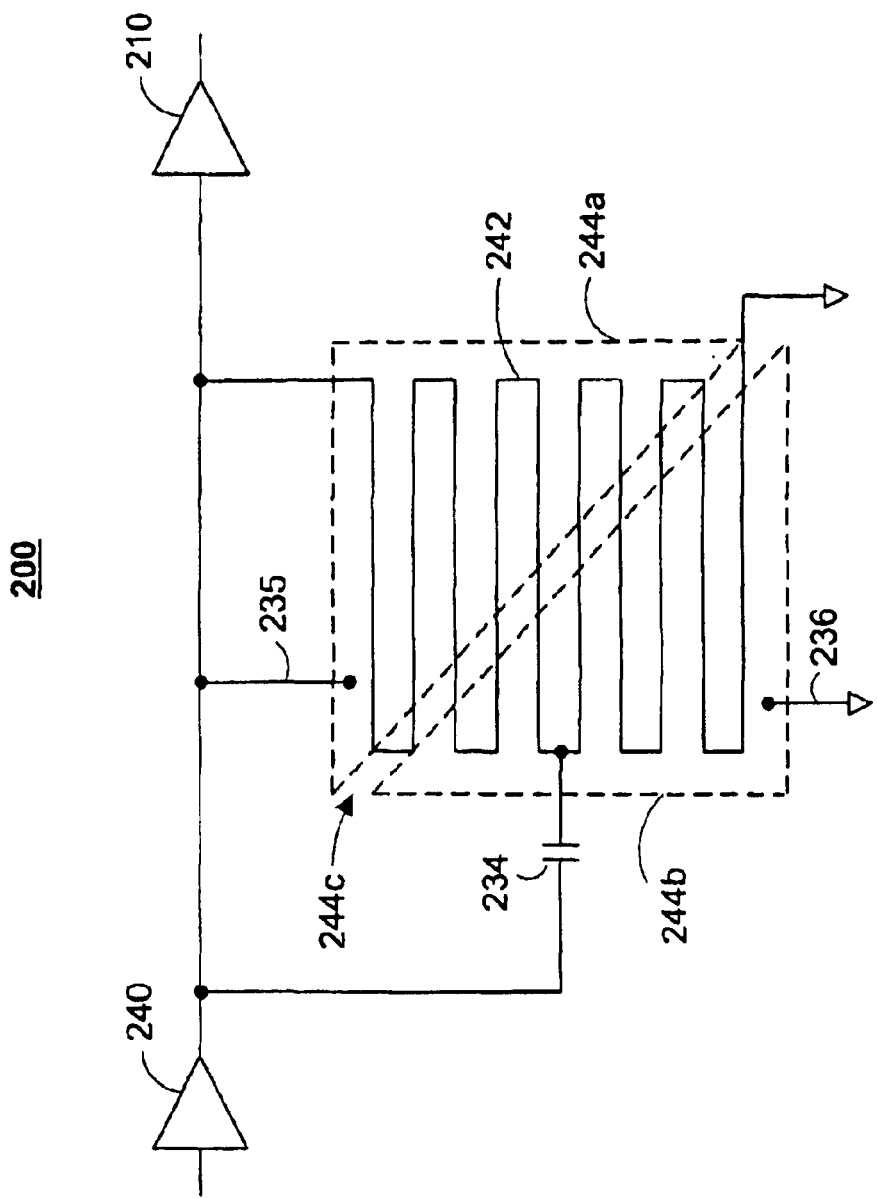
FIG. 7 is a top angle view illustrating an alternate physical layout of a synthetic circuit element according to one embodiment of the present invention.

One way in which the amount of capacitive compensation may be controlled is to vary the resistor area covered by an underlying N-well section. For example, rather than providing complete coverage as shown in FIG. 5, only certain portions of resistor 242 are covered by separate N-well sections 244a and 244b, with portion 244c (the area not enclosed within a dotted line) having no underlying N-well coverage at all (shown in FIG. 7). The shape and size of regions 244a–c may be tailored to increase or decrease the amount of parasitic capacitance compensation. In addition, the amount of parasitic capacitance experienced by resistor 242 will depend on the strength of the applied drive signal and the amount of resistor area without an underlying N-well portion. For example, the larger area 244c becomes the less compensation provided to resistor 242. Furthermore, as can be seen in FIG. 7, N-well section 244b is connected to ground. As a result, no capacitive compensation is provided to this section of resistor 242.

Figure 8:
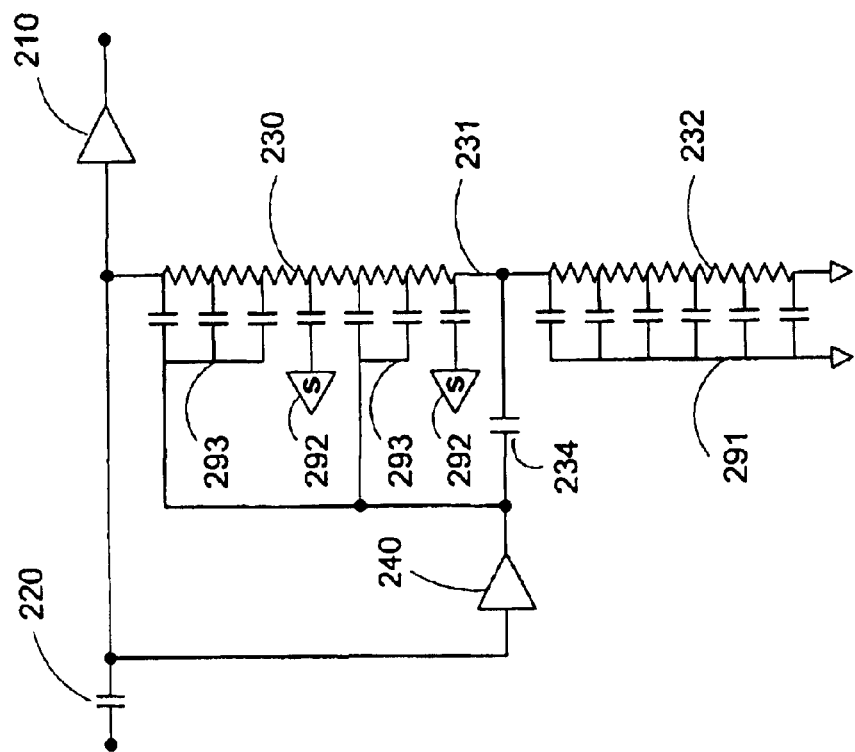
FIG. 8 is an equivalent circuit representation of the circuit shown in FIG. 7.

A schematic diagram generally illustrating the equivalent circuit of the arrangement of FIG. 7 is shown in FIG. 8. In FIG. 8, circuit portion 291 represents the portion of resistor 242 covered by N-well section 244b, circuit portion 292 represents the uncovered section 244c, and circuit portions 293 represents the section covered by N-well 244a. In operation, synthetic circuit element 232 functions as a conventional resistor exhibiting a low pass filter characteristics over frequency. On the other hand, circuit portion 293 provides some capacitive compensation, while section 292 experiences some parasitic capacitance to the substrate (represented by the triangle S symbol).

Although preferred embodiments of the present invention have been disclosed with various circuits connected to other circuits, persons skilled in the art will appreciate that it may not be necessary for such connections to be direct and additional circuits may be interconnected between the shown connected circuits without departing from the spirit of the invention as shown. Persons skilled in the art also will appreciate that the present invention can be practiced by other than the described embodiments. For example, synthetic circuit elements based on an N-type substrate technology may be used rather than P-type. Furthermore, the amount of capacitive compensation provided may be adjustable by programmable switches (e.g., such as multiplexers, EPROMs, EEPROMs, pass transistors, transmission gates, antifuses, laser fuses, metal optional links, etc.) in an integrated circuit so an end-user may vary or select the degree of compensation to meet specific needs. This may be done for example, by dividing semiconductor wells into sections which may be programmably connected or disconnected by the programmable switches thereby altering the shape or size of the well region to obtain the desired compensation, etc. This may also be achieved using laser trimming or altering the DC bias of the well. Programmable switches may also be used to vary the gain of bootstrap amplifier 240, to change the amount of capacitive compensation provided (an external network or component such as a resistor may also be used, if desired).

Moreover, it will be understood that the described embodiments are presented for purposes of illustration and not of limitation, and the present invention is limited only by the claims which follow. Persons skilled in the art will appreciate that the present invention can be practiced by other than the described embodiments, which are presented for purposes of illustration and not of limitation, and the present invention is limited only by the claims which follow.

What is claimed is:

1. In an integrated circuit, a method for providing a synthetic circuit component with a variable impedance characteristic comprising:

providing a resistive circuit element disposed on the integrated circuit, wherein a distributed parasitic capacitance exists between the resistive element and a conductor, and the conductor is also disposed on the integrated circuit;

coupling an output of an amplifier circuit to the conductor; and applying a drive signal from the amplifier circuit to the conductor to vary the amount of distributed parasitic capacitance experienced by the resistive circuit element and thereby vary the impedance of the synthetic circuit element.

2. The method of claim 1 wherein the applying further comprises varying the gain of the amplifier circuit to vary the magnitude of the drive signal to obtain a desired impedance characteristic.

3. The method of claim 1 further comprising applying a signal to the input of the amplifier circuit that is proportional a signal applied to the resistive circuit element.

4. The method of claim 1 wherein the providing further comprises providing a plurality of conductors and wherein the resistive circuit element has a distributed parasitic capacitance to at least some of the plurality of conductors.

5. The method of claim 4 wherein the plurality of conductors includes at least one semiconductor well segment.

6. A method for improving a time domain response of an amplifier circuit so that the amplifier circuit accurately replicates digital signals without suffering from significant amplitude deterioration, the method comprising:

coupling a coupling capacitor to a synthetic circuit component and an amplifier, wherein the synthetic circuit component comprises a conductor and a resistive element, the conductor and the resistive element are coupled together;

coupling a bootstrap amplifier to the coupling capacitor and the synthetic circuit component; and the bootstrap amplifier providing a drive signal to the synthetic circuit component derived from a signal applied to the coupling capacitor so that an impedance of the synthetic circuit component is increased over a certain range of frequencies selected to reduce the amplitude deterioration.

7. A method for reducing component size in an amplifier circuit comprising:

coupling a coupling capacitor to a synthetic circuit component and an amplifier, wherein the synthetic circuit component comprises a conductor and a resistive element, and the conductor and the resistive element are coupled together;

coupling a bootstrap amplifier to the coupling capacitor and the synthetic circuit component;

and the bootstrap amplifier providing a drive signal to the synthetic circuit component derived from a signal applied to the coupling capacitor so that an impedance of the synthetic component is increased over a certain range of frequencies selected to reduce the size of the coupling capacitor.

8. A method for reducing a recovery time of an amplifier circuit comprising:

coupling a coupling capacitor to a synthetic circuit component and an amplifier, wherein the synthetic circuit component comprises a conductor and a resistive element, and the conductor and the resistive element are coupled together;

coupling a bootstrap amplifier to the coupling capacitor and the synthetic circuit component;

and the bootstrap amplifier providing a drive signal to the synthetic circuit component derived from a signal applied to the coupling capacitor so that an impedance of the synthetic component is increased over a certain range of frequencies selected to reduce the recovery time of the amplifier circuit.

9. An amplifier circuit comprising:

a synthetic circuit component and an amplifier that receive an input signal; and a bootstrap amplifier having an output that is coupled to the synthetic circuit component for producing a drive signal provided to the synthetic circuit component, wherein the synthetic circuit component comprises a conductor and a resistive element, the conductor and the resistive element are coupled together, the drive signal being derived from the input signal, and the parasitic capacitance of the synthetic circuit component is operable to be controlled by applying the drive signal to the conductor.

10. An amplifier circuit comprising:

a synthetic circuit element and an amplifier that receives an input signal; and a bootstrap amplifier coupled to the synthetic circuit element for producing a drive signal provided to the synthetic circuit component, the drive signal being derived from the input signal and applied to the synthetic circuit component to compensate for at least some of the parasitic capacitance associated with synthetic element, wherein the bootstrap amplifier is a variable gain amplifier.

11. The amplifier circuit of claim 9 further comprising a coupling capacitor, the coupling capacitor being interposed between the synthetic circuit component and the input signal.

* * * * *